US007013420B2

(12) United States Patent
Hofmann

(10) Patent No.: US 7,013,420 B2
(45) Date of Patent: Mar. 14, 2006

(54) CODED MODULATION METHOD, WHICH TAKES TAILBITS AND THEIR CODING INTO ACCOUNT

(75) Inventor: Frank Hofmann, Hildesheim (DE)

(73) Assignee: Robert Bosch GmbH, Stuttgart (DE)

( * ) Notice: Subject to any disclaimer, the term of this patent is extended or adjusted under 35 U.S.C. 154(b) by 425 days.

(21) Appl. No.: 10/169,661

(22) PCT Filed: Oct. 31, 2001

(86) PCT No.: PCT/DE01/04124

§ 371 (c)(1),
(2), (4) Date: Jan. 8, 2003

(87) PCT Pub. No.: WO02/39690

PCT Pub. Date: May 16, 2002

(65) Prior Publication Data

US 2003/0145273 A1    Jul. 31, 2003

(51) Int. Cl.
*H03M 13/00* (2006.01)
(52) U.S. Cl. ...................................... 714/779; 714/752
(58) Field of Classification Search ................ 714/779, 714/752, 746, 790; 375/262, 260
See application file for complete search history.

(56) References Cited

U.S. PATENT DOCUMENTS

| | | | | |
|---|---|---|---|---|
| 4,908,827 A | * | 3/1990 | Gates .......................... | 714/790 |
| 5,416,801 A | * | 5/1995 | Chouly et al. ............... | 375/260 |
| 5,812,601 A | * | 9/1998 | Schramm ..................... | 375/262 |
| 6,665,833 B1 | * | 12/2003 | Tong et al. .................. | 714/790 |

FOREIGN PATENT DOCUMENTS

| | | |
|---|---|---|
| CN | 1 258 401 | 6/2000 |
| HU | 216 370 | 6/1999 |
| JP | 2000049823 A | * 2/2000 |
| WO | WO 9843383 | 10/1998 |
| WO | WO 02/39690 | 5/2002 |

OTHER PUBLICATIONS

Hideki Imai et al., "A New Multilevel Coding Method Using Error-correcting Codes," IEEE Transactions on Information Theory, vol. IT-23, No. 3, 1977, pp. 371-377.
Jung-Fu Cheng et al., "Complexity-Reduced Multilevel Coding with Rate-Compatible Punctured Convolutional Codes," IEEE Global Telecommunications Conference, including a Communications Theory Mini Conference, Technical Program Conference Record, GLOBECOM' 93, Houston, Texas, US, vol. 1 of 4, Nov. 29-Dec. 2, 1993, pp. 814-818.
H.G. Jardak et al., "Concatenated Codes Using Multilevel Structures for PSK Signalling Over the Rayleigh Fading Channel," IEE Proceeding: Communications, Institution of Electrical Engineers, GB, vol. 141, No. 4, Aug. 1, 1994, pp. 233-236.

(Continued)

*Primary Examiner*—David Ton
*Assistant Examiner*—Dipakkumar Gandhi
(74) *Attorney, Agent, or Firm*—Kenyon & Kenyon

(57) ABSTRACT

A method is presented for the coded modulation of digital data, a modulation being carried out that is coded in multiple stages. In this context, the useful bits for the coded modulation are divided into parallel signal streams, and each signal stream is fed to a specific coder to carry out the channel coding. In the respective coder, the useful bits have tail bits added to them, which, in contrast to the useful bits, are channel-coded using a variable code rate, to achieve a preestablished bit number for a specific coder, so that all signal streams that are coded in parallel contain the same number of bits.

10 Claims, 2 Drawing Sheets

OTHER PUBLICATIONS

Johannes Huber et al., "Codierte Modulation Mittels Multilevel-Codes: Entwicklung und Aktueller Stand der Forschung (Coded Modulation by Multilevel Codes: History and State of the Art)," IT+TI Informationstechnik und technische Informatik, Oldenburg Verlag, Munchen, DE, vol. 41, No. 1, Feb. 1999, pp. 30-35.

Yang-Gi Kang, "Pilot Symbol Assisted Modulation Using Encoder Tail Bits," The Ninth IEEE International Symposium on Personal, Indoor and Mobile Radio Communications, Technical Program Proceedings, Boston, MA, vol. 2 of 3, Sep. 8-11, 1998, pp. 891-894.

* cited by examiner

CODED MODULATION METHOD, WHICH TAKES TAILBITS AND THEIR CODING INTO ACCOUNT

BACKGROUND INFORMATION

The present invention is based on a method for coded modulation in accordance with species of the independent claim.

It is already known to use coded modulation, in which channel coding and modulation are optimized in common. As an equivalent to the term coded modulation, the designation multilevel coding is also familiar.

ADVANTAGES OF THE INVENTION

In contrast, the method for coded modulation according to the present invention having the features of the independent claim has the advantage that, for the so-called tail bits, a variable code rate is used, which is set in each case so that the available transmission capacity can be completely exploited. The transmission framework used specifies the maximum number of modulation symbols. This results in an optimal increase in capacity in comparison to the known methods. The tail bits are added either in the coders or in the upstream bit multiplexer.

Furthermore, the method according to the present invention can be used in a flexible manner, because different transmission modes having different numbers of modulation symbols can be used. In addition, no supplemental signaling from the transmitter to the receiver is required. Finally, the implementation of the method according to the present invention is simple, because no additional computing capacity is required.

As a result of the measures and refinements indicated in the dependent claims, advantageous improvements of the method for coded modulation indicated in the independent claim are possible.

It is especially advantageous that the variable code rate is achieved by a variable puncturation. Puncturation means that in order to achieve a higher code rate, some bits are not transmitted with the rest.

It is advantageous that the variable puncturation scheme is either stored in a table in the transmitter and in the receivers or it is calculated using a familiar calculating standard, the calculating standard being available to the transmitter and to the receivers.

In addition, it is advantageous that the fixed code rate for the useful bits and a preestablished transmission rate are signaled to the receiver, so that from them the receiver can calculate the variable code rates for the tail bits, so as to be able to synchronize itself to the transmitted data.

It is also advantageous that convolutional coding is used, which is a widely used technology for channel coding. In this context, the number of the coded bits is calculated from the number of modulation symbols multiplied by the stage level of modulation m divided by number n of stages. Therefore, the available transmission capacity can be optimally exploited.

Furthermore, it is advantageous that both a transmitter as well as a receiver have a means for carrying out the method according to the present invention.

DRAWING

Exemplary embodiments of the present invention are depicted in the drawing and are discussed in greater detail in the following description.

DESCRIPTION

The digital transmission system Digital Radio Mondiale (DRM) is currently being developed for transmission bands below 30 MHZ. The decision was made to use a multilevel coding (MLC) as the channel coding. In this context, the channel coding and modulation are optimized in common, thus also making it possible to speak of coded modulation. Channel coding adds redundancy to the data, on the basis of which it is possible to detect and correct transmission errors.

In a higher-stage modulation method having a q-nary signal constellation, the signal alphabet has exactly q values. The foundation for the MLC is formed by the partitioning of the signal alphabet into partial quantities. Each division step has assigned to it one component of the address vector of the signal space representation. In this context, each component is protected by its own code. If it is a question of a 2m-stage signal constellation, there is a division into n stages, assuming m=n, in accordance with address vector c (=$c_0$, $c_1$, ..., $c_{n-1}$). Stage level m of the modulation, for example, is not necessarily equal to the number of stages, if a 64-QAM (quadrature amplitude modulation) is used.

Figure 1:
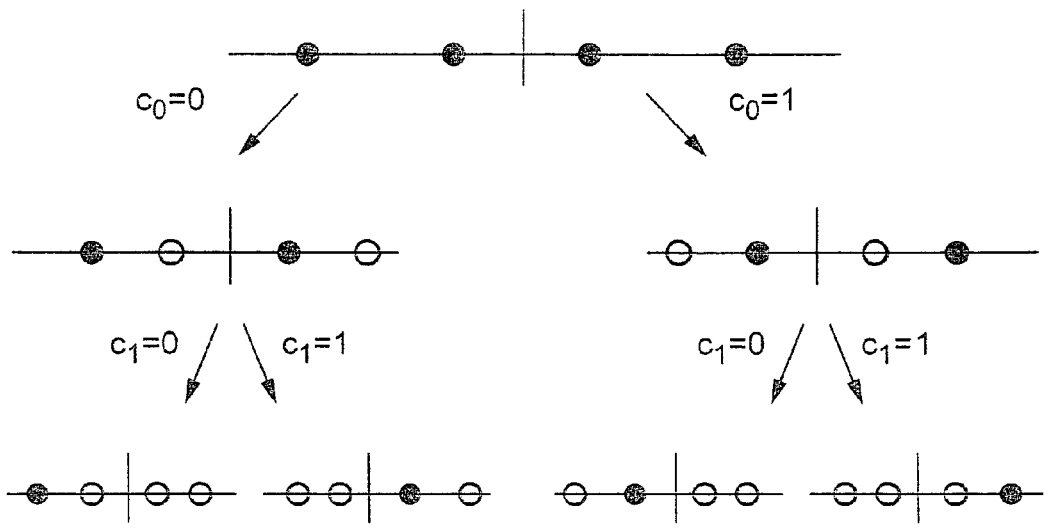
FIG. 1 depicts a partitioning of a 4-ASK (Amplitude Shift Keying).

FIG. 1 depicts the partitioning of a 4-ASK (Amplitude Shift Keying). In the 4-ASK, therefore, four states are coded. The coding of the data stream is accomplished using n parallel coders, code $c_0$ having the smallest code rate $R_0$, i.e., it adds the most redundancy, and it protects the position of the address vector most susceptible to error. In FIG. 1, on the topmost state flow, four states are marked using filled-in circles. Via the middle two state flows, access can be achieved to the individual codable states in a 4-ASK. With regard to the stage, either $c_0$=0 or 1. Correspondingly, the four filled-in circles are divided into two number streams, which have filled-in and empty circles, complementing each other. In the lower four state flows, the individual states are now coded in a 4-ASK, namely 00, 01, 10, and 11. In this context, state 00 has a filled-in circle at the far left, which is then followed by three empty circles. State 01 has the filled-in circle in the third position from the left. State 10 has the filled-in circle at the second position from the left, and state 11 has the filled-in circle at the far right. The other positions have empty circles, symbolizing 0.

Figure 2:
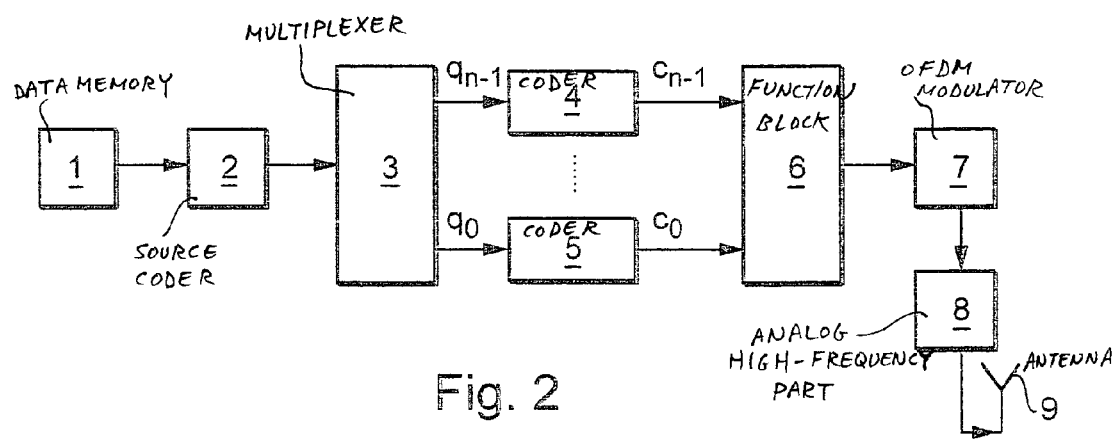
FIG. 2 depicts a block diagram of the transmitter according to the present invention.

In FIG. 2, a block diagram of the transmitter according to the present invention is depicted. In data memory 1, data are contained that are to be transmitted using the transmitter according to the present invention. However, other data sources can also be used here. These data are transmitted from data memory 1 to a source coder 2, which undertakes a source coding to reduce the quantity of the data to be transmitted.

The data that are source-coded in this manner and that have the useful bits are then transmitted to a multiplexer 3, which divides the data stream into n parallel lines. To each of these n lines, which are numbered 0 through n−1, a specific coder is connected, which channel-codes one of data streams ($q_0 \ldots q_{n-1}$). For example, here a coder 5 in line 0 and a coder 4 in line n−1 are depicted. Present at the output of each coder are signals $c_0$ or $C_{n-1}$. Coders 4 and 5 execute the channel coding using a convolutional coding and, in the process, add additional redundancy to the useful bits, so-called tail bits also being added to the useful bits, so as to place each coder 4 and 5, as convolutional coders, into a defined terminal state. A coder 4 and 5 of this type has shift registers, which are each wired in accordance with the coding. The tail bits, here depicted as logical zeros, assure that coders 4 and 5, at the end of the coding, are in a defined state and that, in the receiver, the decoder, at the end of the decoding, is also in a defined state, which is recognized by the fact that all the bits in coders 4 and 5, or the decoders, are logical zeros.

These tail bits are also acted upon by a code rate, which here, however, in accordance with the present invention, is variable. This variable code rate is set so that the available transmission capacity, which is defined by the transmission frame, is completely used. Variable here means that the code rate of the tail bits can be different for each stage. As a result of the variable number of tail bits, it is possible that the number of coded bits, i.e., the coded useful bits plus the coded tail bits, is the same for every stage of the coding scheme. In addition, the number of the coded bits then corresponds to the number of the modulation symbols multiplied by the stage level of modulation m and divided by the number of stages n. In a 4- or 8-ASK, m=n, so that the number of coded bits corresponds to the number of modulation symbols. In a 64-QAM, however, it is possible that m=6 and n=3, so that the number of coded bits corresponds to double the number of modulation symbols.

The data that are channel-coded in this manner are then assigned to signal space points in block 6, in order then to generate the specific modulation symbols.

As the component codes in individual coders 4 and 5, convolutional codes having puncturation are used. Therefore, the code rates can be adjusted to each other in order to achieve the best possible transmission performance. The punctured codes have a period that corresponds to the denominator of the code rate. For example, code 4/5 has precisely five output bits per four input bits. Therefore, the period of the output bits is 5, because no smaller number of output bits is possible, so as to maintain the code rate. In the MLC, a different code rate is used for each stage. To assure that the number of bits at the outputs of all coders 4 and 5 is the same, this number must accordingly be variable. Of course, this only applies to the tail bits, because the code rate for the useful bits remains the same. By changing the code rate of the tail bits, it is possible to influence the number of code bits. In this context, the assumption is made of a maximum code rate for the tail bits, which is reduced, i.e., additional redundancy is added, so as to accomplish an adjustment. In this context, the reduction of the code rate of the tail bits must take place for every stage to that degree, so that output bits occur in every stage, and they correspond to the number of modulation symbols multiplied by m and divided by n. The number of tail bits can be established for every value in a specific range using the puncturation schema. Alternatively, a minimal code rate can be the point of departure, and it can be increased by adjusting the puncturation.

The following example is to clarify the usefulness. When convolutional codes having memory length 6 are used, six tail bits are required to place coder 4 or 5 in a defined terminal state. This defined terminal state is achieved for each transmission frame, in order to prevent the propagation of errors during the decoding in the receiver. The tail bits can be added either in coders 4 and 5 or in multiplexer 3. Acting as a foundation is an 8-ASK as modulation, having m=3 and an MLC having n=3 stages. If the tail bits are provided with a base code rate of 2/3, then precisely nine coded bits arise, corresponding to the six zeros (tail bits) at the coder input. If there are 200 modulation symbols in a transmission frame, then ideally 200 coded bits are produced per stage. If the minimum number of nine tail bits is removed therefrom, then 191 coded useful bits are generated as the maximum possible number per stage. If the period is considered for every stage, then the result is that for stage 0 having a code rate of 1/3, exactly 189 coded bits arise (corresponding, at the code rate, to 63 useful bits) and consequently 11 tail bits are required. For stage 1 having a code rate of 2/3, exactly 189 coded bits are present (corresponding, at the present code rate, to 126 useful bits), so that once again 11 tail bits are necessary. In stage 2, there are 190 coded bits at a code rate of 4/5 (corresponding to 152 useful bits), and ten tail bits are therefore necessary. The code rates of the tail bits of the stages are changed from the base code rate 2/3 to 6/11 for stage 0 and stage 1, or to 6/10 for stage 2. Thus it is achieved that all modulation symbols are allocated using coded bits. The result of this calculation is that 341 useful bits are transmitted, which amounts to an increase in capacity in comparison to conventional methods. In this context, the result is 568 coded bits, which correspond to 341 useful bits. In conventional methods using code rates 4/5 and 2/3, it would be necessary to select a number of coded bits, and therefore of useful bits, that is divisible by 3 and 5. Using the variable code rate, it is now possible to achieve an optimum value for the coded bits.

In FIG. 2, the modulation symbols coded in this manner are transmitted from function block 6 to an OFDM modulator 7, which divides the individual modulation signals into frequency carriers that are situated close to each other, and that are orthogonal with respect to each other. The OFDM signals that arise in this manner, are then mixed in an analog high-frequency part 8, amplified, and then broadcast using an antenna 9.

Figure 3:
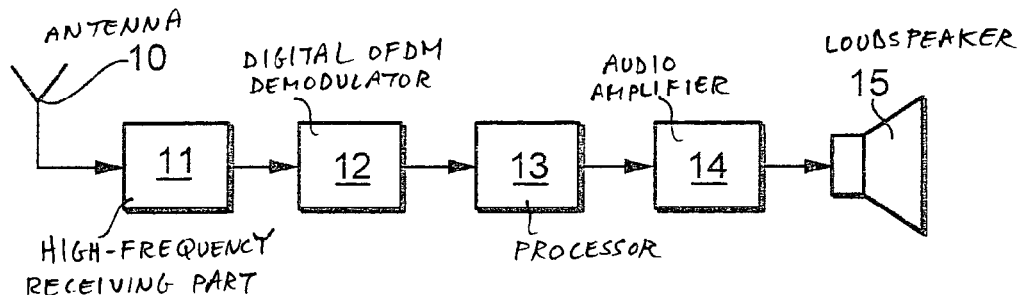
FIG. 3 depicts a block diagram of the receiver according to the present invention.

In FIG. 3, a block diagram of the receiver according to the present invention is depicted. An antenna 10 is connected to is an input of a high-frequency receiving part 11 for receiving the OFDM signals. High-frequency receiving part 11 converts the received signals to an intermediate frequency, and then amplifies and filters them. In addition, high-frequency receiving part 11 transmits these signals to a digital part 12, which digitalizes the received signals and carries out an OFDM demodulation. The modulation symbols obtained in this manner are then demodulated by a processor 13 and are converted into a data stream, which is transformed by processor 13 into analog signals, which are then amplified by audio amplifier 14, so as finally to be reproduced using loudspeaker 15. Alternatively, it is also possible here to receive multimedia data which are then reproduced optically. In addition, the transmitter signals to the receivers what the fixed code rate is for the channel coding of the useful bits and what the transmission rate is. In this way, it is then possible for the receivers to determine the specific variable code rate for the tail bits.

Figure 4:
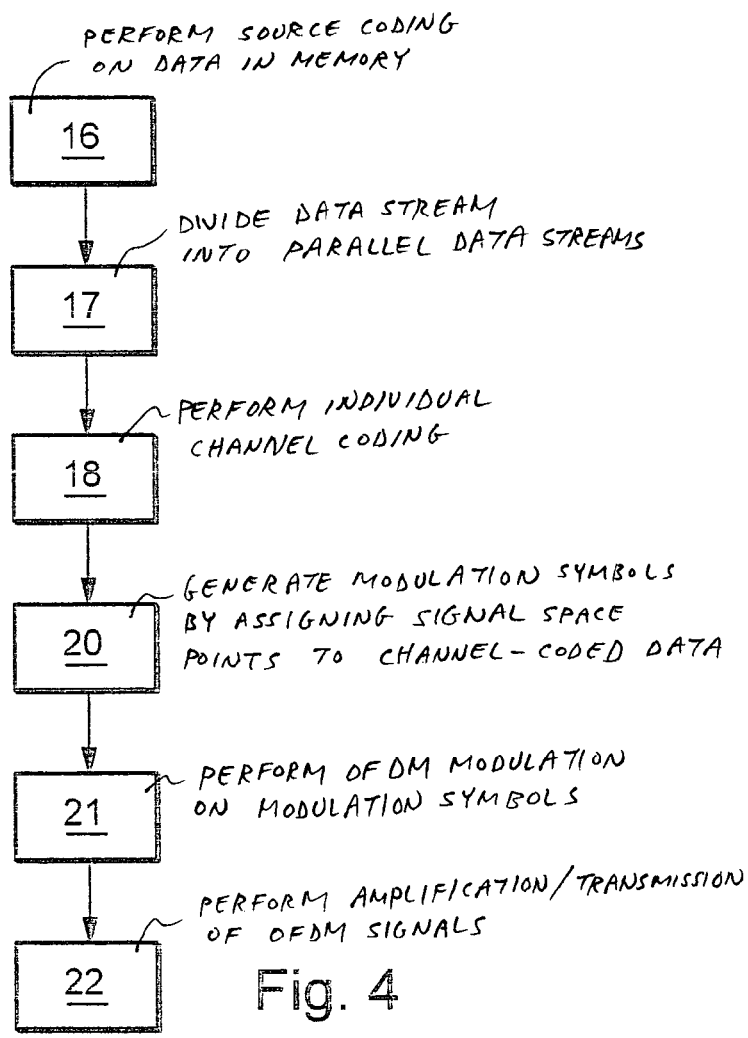
FIG. 4 depicts a flowchart of the method according to the present invention.

In FIG. 4, the method according to the present invention is depicted as a flowchart. In method step 16, the data are made available by data memory 1 and are subjected to a source coding by source coder 2. In method step 17, the data stream that arises in this manner is divided by bit multiplexer 3 into data streams that run in parallel. In method step 18, the individual coders carry out the channel coding, the useful bits being coded using a fixed code rate, and the tail bits using a variable code rate, which is a function of whether the number of output bits of individual coders 4 and 5 agrees with the number of modulation symbols. This is achieved using the so-called puncturation scheme of the tail bits of each stage. In method step 20, in function block 6, signal space points are assigned to the channel-coded data that arise in this manner so as to generate the modulation symbols. In method step 21, the modulation symbols are subjected to an OFDM modulation, and in method step 22 the amplification, or transmission, of the OFDM signals takes place. In this context, the fixed code rate for the useful bits and the transmission rate are also transmitted by the transmitter as signaling to the receivers, so that the receivers are able to calculate the variable code rates on the basis of the received data.

What is claimed is:

1. A method for providing coded modulation of digital data having useful bits, the method comprising:

performing multi-stage coded modulation of the digital data, wherein the useful bits are divided into parallel signal streams;

subjecting each of the parallel signal streams by a respective coder of a plurality of coders to channel coding, wherein the useful bits are channel coded using at least one fixed code rate;

adding tail bits to the useful bits, wherein the tail bits ensure that each coder of the plurality of coders is in a recognizable defined state;

channel coding the tail bits in the respective coder using a variable code rate to provide a pre-established bit number for the respective coder, so that the parallel signal streams contain a same number of coded bits; and assigning channel-coded data to signal space points to generate at least one modulation symbol.

2. The method of claim 1, wherein the variable code rate of the tail bits is provided by variable puncturation.

3. The method of claim 2, wherein all puncturation schemas are made available to a transmitter and a plurality of receivers.

4. The method of claim 3, wherein the at least one fixed code rate and a transmission rate are signaled to the plurality of receivers.

5. The method of claim 2, wherein all puncturation schemas of the tail bits are calculated by calculation methods made available to a transmitter and a plurality of receivers.

6. The method of claim 5, wherein the at least one fixed code rate and a transmission rate are signaled to the plurality of receivers.

7. The method of claim 1, wherein channel coding is provided by convolutional coding.

8. The method of claim 1, wherein the number of coded bits is generated by a number of the at least one modulation symbol multiplied by a stage level of the modulation and divided by a number of stages.

9. A transmitter for providing coded modulation of digital data having useful bits, the transmitter comprising:

a first arrangement to provide multi-stage coded modulation of the digital data, wherein the useful bits are divided by a mulitplexer into parallel signal streams;

a second arrangement to subject each of the parallel signal streams by a respective coder of a plurality of coders to channel coding, wherein the useful bits are channel coded using at least one fixed code rate;

a third arrangement to add tail bits to the useful bits, wherein the tail bits ensure that each coder of the plurality of coders is in a recognizable defined state;

a fourth arrangement to channel code the tail bits in the respective coder using a variable code rate to provide a pre-established bit number for the respective coder, so that the parallel signal streams contain a same number of coded bits; and a fifth arrangement to assign channel-coded data to signal space points to generate at least one modulation symbol;

wherein the plurality of coders correspond to a number of stages of the multi-stage coded modulation.

10. A receiver for receiving coded modulation of digital data having useful bits, the receiver comprising:

an evaluation arrangement to evaluate a signaling for demodulating modulation symbols and for a channel coding;

wherein the modulation symbols and the channel coding are provided by a method for providing coded modulation of digital data having useful bits, the method including:

performing multi-stage coded modulation of the digital data, wherein the useful bits are divided into parallel signal streams;

subjecting each of the parallel signal streams by a respective coder of a plurality of coders to channel coding, the useful bits being channel coded using at least one fixed code rate;

adding tail bits to the useful bits, wherein the tail bits ensure that each coder of the plurality of coders is in a recognizable defined state;

channel coding the tail bits in the respective coder using a variable code rate to provide a pre-established bit number for the respective coder, so that the parallel signal streams contain a same number of coded bits; and assigning channel-coded data to signal space points to generate at least one modulation symbol; and wherein all puncturation schemas of the tail bits are made available to a transmitter and a plurality of receivers.

* * * * *

UNITED STATES PATENT AND TRADEMARK OFFICE
CERTIFICATE OF CORRECTION

PATENT NO. : 7,013,420 B2
APPLICATION NO. : 10/169661
DATED : March 14, 2006
INVENTOR(S) : Frank Hofmann It is certified that error appears in the above-identified patent and that said Letters Patent is hereby corrected as shown below:

On the Title page, item (57) ABSTRACT, line 1, remove "is presented"

On the Title page, item (57) ABSTRACT, change "a modulation being carried out" to --a modulation is performed--

On the Title page, item (57) ABSTRACT, change "a specific coder to carry out" to --a specific coder to perform--

Column 1, line 5, change "BACKGROUND INFORMATION" to --FIELD OF THE INVENTION--

Column 1, line 8, change "is based on" to --relates to--

Column 1, line 9, change "modulation in accordance with species of the independent claim." to --modulation.--

Column 1, line 10, insert the heading --BACKGROUND INFORMATION--

Column 1, line 11, change "It is already known to use" to --Other prior systems use--

Column 1, line 17, change "ADVANTAGES OF THE INVENTION" to --SUMMARY OF THE INVENTION--

Column 1, line 19, change "In contrast, the method" to --In the exemplary method--

Column 1, line 20, change "the present invention having the features of the independent claim has the advantage that," to --the present invention,--

Column 1, line 23, change "can be completely" to --may be completely--

Column 1, lines 26-27, change "the known methods." to --the methods of other prior systems.--

Column 1, line 29, change "the method" to --the exemplary method--

Column 1, line 30, change "can be used" to --may be used--

Column 1, lines 37-40, remove "As a result… claims are possible"

UNITED STATES PATENT AND TRADEMARK OFFICE
CERTIFICATE OF CORRECTION

PATENT NO. : 7,013,420 B2
APPLICATION NO. : 10/169661
DATED : March 14, 2006
INVENTOR(S) : Frank Hofmann It is certified that error appears in the above-identified patent and that said Letters Patent is hereby corrected as shown below:

Column 1, line 42, change "It is especially advantageous that the variable code rate" to --The variable code rate--

Column 1, line 46, change "It is advantageous that the variable puncturation scheme" to --The variable puncturation scheme--

Column 1, line 50, change "standard being available" to --standard is available--

Column 1, line 52, remove "it is advantageous that"

Column 1, line 54, change "the receiver can" to --the receiver may--

Column 1, line 57, change "It is also advantageous that convolutional coding is used," to --convolutional coding is used--

Column 1, line 63, change "capacity can be" to --capacity may be--

Column 1, line 65, remove "it is advantageous that"

Column 1, line 66, change "have a means for carrying out the method" to --include an arrangement for performing the exemplary method--

Column 2, line 1, remove "DRAWING"

Column 2, line 4, change "depicted in the drawing and are discussed" to --shown in the drawings and are described--

Column 2, line 6, insert the heading --BRIEF DESCRIPTION OF THE DRAWINGS--

Column 2, line 6, change "FIG. 1 depicts a partitioning of a 4-ASK (Amplitude Shift Keying)." to --"FIG. 1 shows a partitioning of a 4-ASK.--

Column 2, line 8, change "FIG. 2 depicts a block diagram of the transmitter" to --FIG. 2 shows a block diagram of the exemplary transmitter--

Column 2, line 10, change "FIG. 3 depicts a block diagram of the receiver" to --FIG. 3 shows a block diagram of the exemplary receiver--

Column 2, line 12, change "FIG. 4 depicts a flow chart of the method" to --FIG. 4 shows a flowchart of the exemplary method--

UNITED STATES PATENT AND TRADEMARK OFFICE
CERTIFICATE OF CORRECTION

PATENT NO.      : 7,013,420 B2
APPLICATION NO. : 10/169661
DATED           : March 14, 2006
INVENTOR(S)     : Frank Hofmann It is certified that error appears in the above-identified patent and that said Letters Patent is hereby corrected as shown below:

Column 2, line 15, change "DESCRIPTION" to --DETAILED DESCRIPTION--

Column 2, line 22, change "also making it possible" to --also allowing--

Column 2, line 24, change "it is possible to detect and correct transmission errors." to --transmission errors are detected and corrected.--

Column 2, line 25, change "having a q-nary" to --including a q-nay--

Column 2, line 26, change "has exactly q values" to --includes exactly q values--

Column 2, line 29, change "has assigned to it" to --includes assigned to it--

Column 2, line 36, remove "(quadrature amplitude modulation)"

Column 2, line 37, change "FIG. 1 depicts" to --FIG. 1 shows--

Column 2, line 40, change "having the smallest" to --including the smallest--

Column 2, line 44, change "access can be" to --access may be--

Column 2, line 48, change "which have" to --which include--

Column 2, line 51, change "state 00 has" to --state 00 includes--

Column 2, line 52, change "state 01 has" to --state 01 includes--

Column 2, line 56, change "positions have" to --positions include--

Column 2, line 57, change "of the transmitter" to --of the exemplary transmitter--

Column 2, line 61, change "can also be used" to --may also be used--

Column 2, line 66, change "have the useful bits" to --include the useful bits--

Column 3, line 4, change "line n-1 are depicted." to --line n-1 are shown.--

Column 3, line 10, change "this type has shift" to --type includes shift--

UNITED STATES PATENT AND TRADEMARK OFFICE
CERTIFICATE OF CORRECTION

PATENT NO.       : 7,013,420 B2
APPLICATION NO.  : 10/169661
DATED            : March 14, 2006
INVENTOR(S)      : Frank Hofmann It is certified that error appears in the above-identified patent and that said Letters Patent is hereby corrected as shown below:

Column 3, line 12, change "here depicted as" to --here shown as--

Column 3, line 23, change "can be different" to --may be different--

Column 3, line 24, remove "it is possible that"

Column 3, line 39, change "codes having puncturation" to --codes including puncturation--

Column 3, line 40, change "can be adjusted" to --may be adjusted--

Column 3, line 42, change "have a period" to --include a period--

Column 3, line 43, change "code 4/5 has" to --code 4/5 includes--

Column 3, line 52, remove "it is possible to influence"

Column 3, line 53, change "code bits." to --code bits may be influenced.--

Column 3, line 57, change "must take place" to --occurs--

Column 3, line 60, change "can be established" to --may be established--

Column 3, line 62, change "can be the point" to --may be the points--

Column 3, line 63, change "can be increased" to --may be increased--

Column 4, line 3, change "The tail bits can" to --The tail bits may--

Column 4, lines 27-28, change "transmitted, which amounts to an increase in capacity in comparison to conventional methods." To --transmitted.--

Column 4, line 30, change "In conventional methods," to --In methods of other prior systems,--

Column 4, line 33, remove "it is now possible to achieve"

Column 4, line 34, change "the coded bits." to --the coded bits may be achieved.--

Column 4, line 43, change "of the receiver" to --of the exemplary receiver--

UNITED STATES PATENT AND TRADEMARK OFFICE
CERTIFICATE OF CORRECTION

PATENT NO.       : 7,013,420 B2
APPLICATION NO.  : 10/169661
DATED            : March 14, 2006
INVENTOR(S)      : Frank Hofmann It is certified that error appears in the above-identified patent and that said Letters Patent is hereby corrected as shown below:

Column 4, line 44, change "is depicted." to --is shown.--

Column 4, line 51, change "carries out an OFDM demodulation." to --performs an OFDM demodulation.--

Column 4, lines 56-57, remove "it is also possible here to receive"

Column 4, line 57, change "multimedia data" to --multimedia data may be received--

Column 4, line 61, change "In this way, it is then possible for the receiver to determine" to --In this manner, the receiver may determine--

Column 4, line 63, change "In FIG. 4, the method" to --In FIG. 4, the exemplary method--

Column 4, line 64, change "is depicted as" to --is shown as--

Column 5, line 2, change "individual codes carry out" to --individual codes perform--

Column 5, line 3, change "bits being coded" to --bits are coded--

Column 5, line 14, change "takes place." to --occurs.--

Signed and Sealed this

Thirtieth Day of January, 2007

JON W. DUDAS
*Director of the United States Patent and Trademark Office*